United States Patent [19]
Rakhimov et al.

[11] Patent Number: 6,042,900
[45] Date of Patent: *Mar. 28, 2000

[54] CVD METHOD FOR FORMING DIAMOND FILMS

[75] Inventors: Alexander Tursonovich Rakhimov; Nikolay Vladislavovich Suetin; Mikhail Arkadievich Timofeyev; Valentin Akimovich Tugarev; Vladimir Ivanovich Rezunenko, all of Moscow, Russian Federation

[73] Assignee: Alexander Rakhimov, Moscow, Russian Federation

[*] Notice: This patent issued on a continued prosecution application filed under 37 CFR 1.53(d), and is subject to the twenty year patent term provisions of 35 U.S.C. 154(a)(2).

[21] Appl. No.: 08/614,194

[22] Filed: Mar. 12, 1996

[51] Int. Cl.$^7$ ............................ B05D 3/06; C23C 16/26
[52] U.S. Cl. ............ 427/577; 427/249.8; 427/249.11; 427/255.5; 427/255.7; 427/309; 427/372.2; 427/573
[58] Field of Search ..................... 427/577, 573, 427/249, 255.5, 309, 249.8, 249.11, 255.7, 372.2; 423/446

[56] References Cited

U.S. PATENT DOCUMENTS

| | | | |
|---|---|---|---|
| 4,353,936 | 10/1982 | Nozaki et al. | 427/309 |
| 5,342,660 | 8/1994 | Cann et al. | 427/577 |
| 5,474,808 | 12/1995 | Aslam | 427/249 |
| 5,478,650 | 12/1995 | Davanloo et al. | 428/408 |
| 5,505,649 | 4/1996 | Park | 445/50 |
| 5,509,840 | 4/1996 | Winsor | 445/26 |
| 5,519,285 | 5/1996 | Ukegawa et al. | 313/594 |
| 5,521,805 | 5/1996 | Lim | 362/221 |
| 5,523,656 | 6/1996 | Luursema | 315/308 |
| 5,523,930 | 6/1996 | Fritts | 362/223 |
| 5,525,872 | 6/1996 | Achten et al. | 315/291 |
| 5,528,108 | 6/1996 | Cisneros | 315/169.3 |

FOREIGN PATENT DOCUMENTS

| | | |
|---|---|---|
| 63-215595 | 9/1988 | Japan . |
| 5-326419 | 12/1993 | Japan . |
| 5-335301 | 12/1993 | Japan . |

OTHER PUBLICATIONS

Polushkin, V. et al., "Diamond film deposition by downstream d.c. glow discharge plasma chemical vapour deposition," *Diamond and Related Materials*, (1994). No month and page data.

Rakhimov, A.T. et al., "Examination of Electron Field Emission Efficiency and Homogeneity From CVD Diamond Films," *Proc. Appl Diam. Conf.*, 1995, No month and page data.

Stiegler, J., "Plasma–assisted CVD of diamond films by hollow cathode are discharge," *Diamond and Related Materials*, 2 (1993) pp. 413–416. No month data.

*Primary Examiner*—Roy V. King
*Attorney, Agent, or Firm*—Stein, Schifino & Van Der Wall

[57] ABSTRACT

Method is provided for forming CVD nano diamond films for use as cold cathodes in microelectronic devices. Conditions for forming the film outside the plasma region between the cathode and a grid anode are disclosed. Heating of the grid anode makes possible a combination of glow discharge and hot filament deposition.

20 Claims, 5 Drawing Sheets

CVD METHOD FOR FORMING DIAMOND FILMS

BACKGROUND OF THE INVENTION

1. Field of the Invention

This invention pertains to a method for forming nanocrystaline diamond films to be used for cold emission of electrons. More particularly, apparatus and method are disclosed for depositing such nanocrystalline diamond films on insulating or non-insulating substrates.

2. Description of the Related Art

Field emitters are used as electron sources in such applications as electron microscopes, flat panel displays and other vacuum microelectronics applications. In cathodoluminescence-based flat panel displays or field emission displays (FEDs), an array of field emitters acts as cold electron sources for the many pixels in the matrix display. The emission of each cold electron source is controlled by output voltages generated by solid state driver circuits. FED panels use color-emissive phosphors which are energized by emission from the array of field emitters. FED panels offer the potential for being energy-efficient, bright and providing saturated colors similar to those of a cathode ray tube (CRT). Such emitters have been reviewed in the article "Diamond-based field emission flat panel displays," *Solid State Tech.*, May, 1995, p. 71. The characteristics needed for the cathode have been discussed in the article "Field Emission Characteristic Requirements for Field Emission Displays," 1994 Int'l. Display Res. Conf., Soc. for Info. Display, October 1994.

The use of a new glow discharge method for depositing diamond films was disclosed in the paper "Diamond film deposition by downstream d.c. glow discharge plasma chemical vapour deposition," *Diamond and Related Materials*, 1994. The emission properties of diamond films prepared by this method were not reported.

Although diamond thin film growth using the chemical vapor deposition (CVD) method has usually been assisted by only thermal or plasma energy, in the paper "Plasma-assisted CVD of diamond films by hollow cathode arc discharge," *Diamond and Related Materials*, 2, 1993, 413–416, the use of a combination of thermal and plasma decomposition of gas mixtures was suggested for a hollow cathode arc discharge. In a hollow cathode arc discharge, dissociation of the reactant gases occurs at the hot cathode surface and in the plasma between the electrodes. But, a hollow cathode arc discharge operates at a low pressure (up to 30 torr) only and has a limited deposition area up to only about 10 $cm^2$. Also, hot cathode material may be sputtered by ions in a hollow cathode arc discharge and thereby may produce contamination of films. In a DC glow discharge, the cathode is cold and the hot anode is not bombarded by ions.

Although use of the diamond thin films described above has dramatically improved the emission qualities of field emitters, higher electron emission which is uniform over the diamond surface is needed. Methods and conditions for formation of CVD diamond thin films at an economical rate that will produce high emission currents that are more uniform over larger areas are needed.

SUMMARY OF THE PRESENT INVENTION

We have discovered that the method for depositing a diamond thin film on a substrate by chemical vapor deposition using a glow discharge and a "downstream configuration" along with certain combinations of operating conditions produces diamond films having improved electron emission properties. A first anode is a grid, and the substrate is positioned between this grid and a second anode. The cathode is positioned nearest and at a selected distance from the first anode, and a plasma is generated between them. The substrate and the grid anode are heated to selected temperatures and pressure in the reactor is adjusted to the range from about 50 torr to about 300 torr. The second anode may be at the same electrical potential as the grid anode or may be at a different potential. The substrate may or may not be electrically conductive.

In one embodiment, the substrate is monocrystalline silicon and is heated to about 900° C. with hydrogen in the reactor to remove the oxide film from the silicon, then a mixture of about 7 to about 12 percent methane and hydrogen is introduced into the reactor to form a silicon carbide film on the surface of the substrate. Subsequently, a diamond film is grown after methane concentration in the mixture has been reduced to the range of about 3 percent to 6 percent. The film is then annealed and non-diamond materials are removed from the film by contact with hydrogen.

Films formed by the method of this invention were found to have electron emission properties which make them suitable for use as cold cathodes in flat panel displays and other vacuum microelectronics applications. In another embodiment, the films could be made even more uniform in emission properties when the substrate was moved as the diamond film was grown on the substrate.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
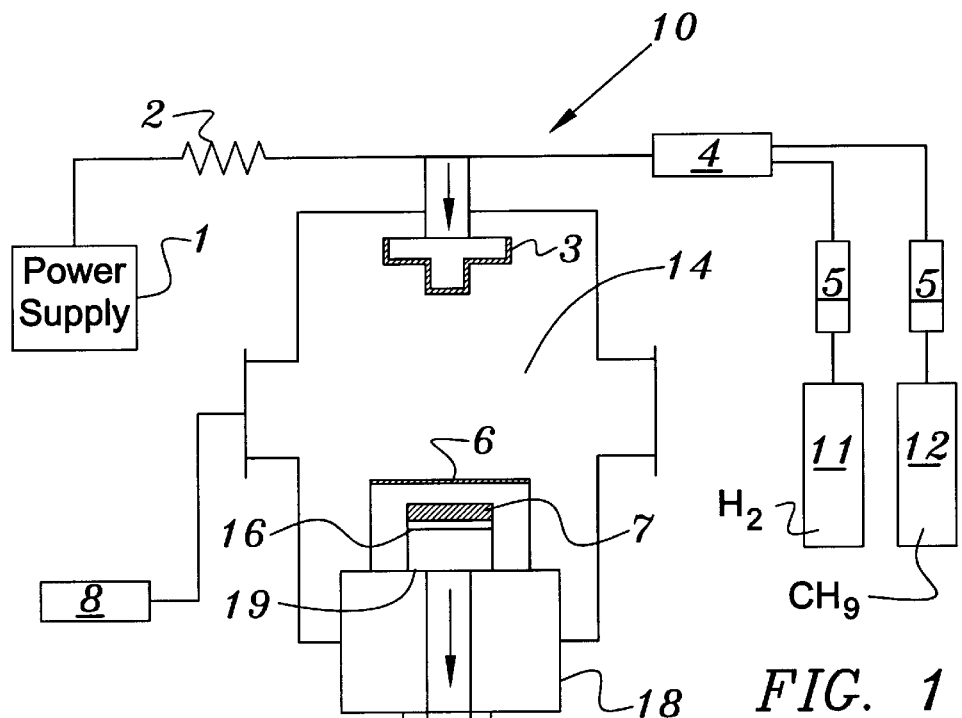
FIG. 1 is a sketch of the apparatus to be used in one embodiment of the method of this invention.

Referring to FIGS. 1 and 2, schematic diagrams of a deposition system for depositing films using DC glow discharge is shown.

Reactor 14, preferably made of stainless steel, encloses cathode 3, anode grid 6 and substrate 7. Cathode 3 may be mounted on a copper holder adapted for the circulation of cooling water. DC power supply I provides electrical power through resistor 2. Gases such as hydrogen ($H_2$) and methane ($CH_4$) are supplied from containers 11 and 12 through electronic mass flow controllers 5 and buffer volume 4. A variety of gases may be supplied through the system, including ethyl alcohol and other carbon-containing gases which are known to produce CVD diamond. Vacuum pumps 8 maintain a pressure of about 100 to 300 torr when the gas flow rate is maintained in the range of about 500 standard $cm^3$/minute (sccm) through reactor 14.

Substrate 7, which is usually a molybdenum or silicon wafer, is placed on substrate holder 16, which may also be a second anode 19, which is usually grounded. Substrate holder 16 may be electrically isolated from the second anode 19, so that substrate 7 is insulated from second anode 19, or both may be grounded. Substrate holder 16 also includes a heating element (not shown) to heat substrate 7, normally from 700° to 1100° C. A preferred operating temperature is about 900°. Substrate 7 may also be a ceramic. In one embodiment, the surface of substrate holder 16 includes small openings (not shown) over which substrate 7 is placed. The small openings are connected to vacuum pump 8, which when turned on holds substrate 7 in place by suction force. Water cooling is provided by flow in the center of substrate holder 16, the flow being radially outward through copper channels.

Substrate 7, which may be first seeded by a standard procedure of either scratching with diamond powder or immersion in an ultrasonic bath, is placed underneath the grid 6 to position the substrate 7 "downstream" or out of the discharge region. By placing substrate 7 out of the plasma region, the glow discharge CVD technique can be used to grow diamond thin films on substrate 7 even when the substrate is an electrical insulator. The distance between the grid 6 and the surface of the substrate 7 ranges between 0.1 and 5 mm.

Figure 2A:
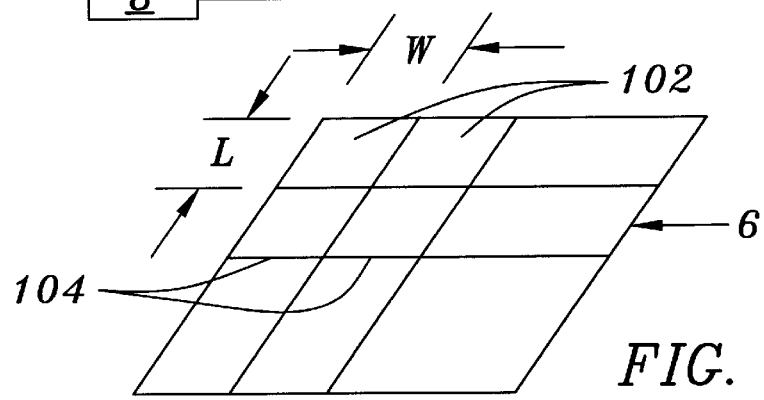
FIG. 2(*a*) and 2(*b*) are detailed sketches of the grid anode and the cathode of the apparatus of FIG. 1.

The grid 6 is formed as a mesh made preferably from 0.3-mm wire. The wire material used is preferably tungsten. As shown in FIG. 2A, the mesh includes a plurality of openings 102 defined by horizontal and/or vertical wires 104. Each opening 102 has a width W of about 0.1 mm to about 5 mm and a length L of about 0.1 to about 5 mm. In a preferred embodiment of the method of this invention, grid 6 is heated. Heating is achieved by discharge current. The grid temperature is increased to above 1100° C. At such high temperatures, grid 6 behaves as a hot filament to increase the diamond film growth rate on substrate 7. The high temperature also allows formation of film material having a crystal structure which is effective when used as a cold cathode. When lower grid temperatures are used, the deposited films have a different crystal structure. We have discovered that at grid temperatures below 1300° C. the films grown are not as effective for cold electron emission.

Figure 2B:
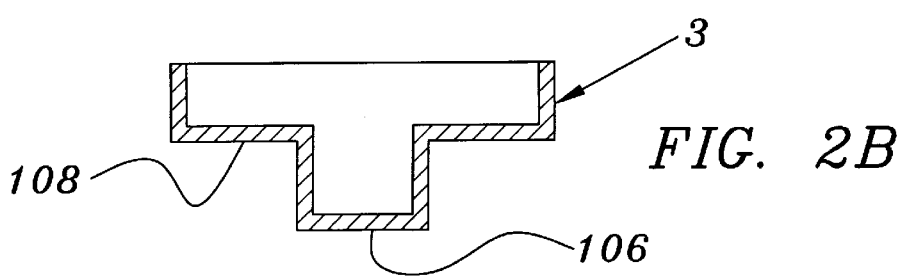

Cathode 3 is preferably formed from a metallic plate having a large number of drilled small perforations or from a porous metallic diaphragm. As shown in FIG. 2B, tip 106 of cathode 3 has a special form, referred to as Rogovskey's Form. Tip 106 is a generally round or rectangular member protruding from surface 108 of cathode 3. The special shape of cathode 3 provides a more homogenous electric field. The distance between cathode 3 and grid 6 is in the range from about 5 to about 50 mm. A negative voltage is applied to cathode 3 while grid 6 is grounded. The voltage between grid 6 and the cathode 3 is preferably in the range from about 600 volts to about 1200 volts. The power dissipation between the cathode 3 and the grid 6 is preferably from about 0.1 kW per $cm^2$ to about 5 kW per $cm^2$ of the substrate. When hydrogen is brought into chamber 14 at a pressure of between about 50 and about 300 torr and the desired voltage is applied to cathode 3, substrate 7 is heated to the desired temperature by plasma. After this, methane ($CH_4$) is also brought into chamber 14. The flow rates of the methane and hydrogen gases are controlled by the electronic mass flow controllers 5. The gas flow rate is preferably between about 200 sccm and about 1000 sccm.

When sufficient voltage is applied between cathode 3 and grid 6, ionization occurs in the gaseous column in chamber 14 between cathode 3 and grid 6 to form a discharge. A cathode sheath region is formed between the plasma and cathode 3, and another sheath region is formed between the plasma and grid 6.

The deposition process includes four stages. For a silicon substrate, first, a film of silicon oxide on substrate 7 must be etched or removed. This preferably occurs at a substrate temperature of about 900° C. with hydrogen in the chamber at a pressure of about 50–300 torr. In the second stage, methane is also admitted to the chamber 14 to achieve a methane concentration from about 7 percent to about 12 percent along with the hydrogen. In this stage, silicon carbide is formed on the substrate surface. The step of forming the silicon carbide increases the adhesion of the diamond thin film to silicon substrate 7. Also, the silicon carbide layer improves electron injection from the silicon substrate into the diamond films and increases electron emission from the diamond film grown during the third stage. In the third stage, polycrystalline diamond is grown on the surface. In this stage, the methane concentration in the gas mixture is reduced to between about 3 percent to about 6 percent.

Using the process described above, nanocrystalline diamond thin film is grown on substrate 7. The deposition rate of the film is up to about 20 microns/hr. The rate is increased when the temperature of grid 6 is increased above 1100° C. The temperature of grid 6 may be increased up to about 2500° C. The method of diamond film deposition of this invention then becomes, in effect, a combination of glow discharge and hot filament deposition. To the knowledge of the inventors, diamond film growth under conditions of heating a grid anode near the substrate has not heretofore been reported. The thickness of the films grown is selected and is determined by time for growth, but is normally from about 0.3–2.0 microns. In stage 4, the gas inflow again consists of only hydrogen. This is the step of annealing, and it lasts from about 5 to 15 minutes.

Parameters that affect the nanocrystaline diamond grain size include the concentration of methane and the pressure and temperature at which the deposition occurs. On one sample, it was determined that the crystal or grain size is about 20 nm. The grain size may be measured using scanning electron microscopy, STM and X-ray diffractometry.

Figure 3:
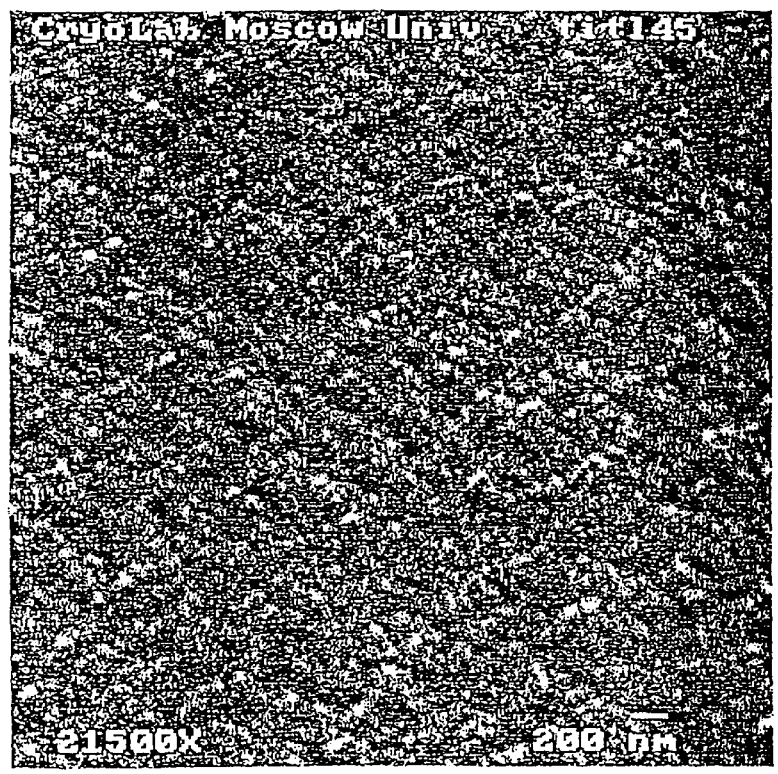
FIG. 3 is a scanning electron microscope image of a diamond film grown by the method of this invention.

Referring to FIG. 3, a scanning electron microscope image of the surface topography of a sample of a nanocrystaline diamond thin film deposited by the method of this invention is shown. The size of individual crystals is seen to be in the range of 100 nm or less and the crystals are uniform in size.

Figure 4:
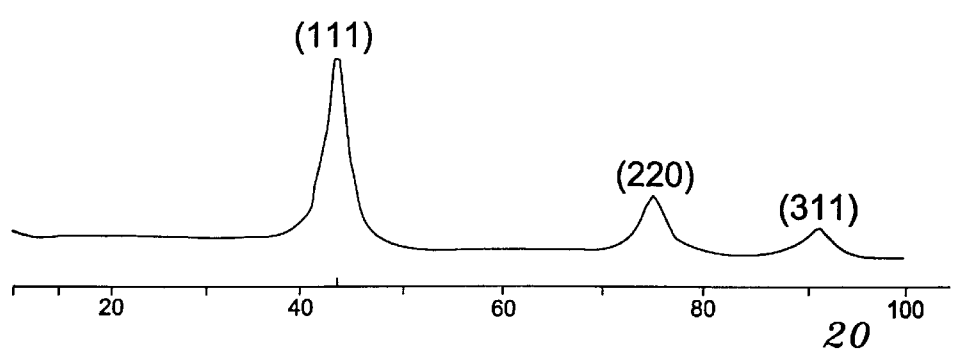
FIG. 4 is an x-ray diffraction pattern of a diamond film grown by the method of this invention.

FIG. 4 shows x-ray diffraction data for a nanocrystalline sample made by the method of this invention. The line-broadening observed is a result of the very small crystal size of the sample, and may also indicate high defect density in the crystals.

Figure 5:
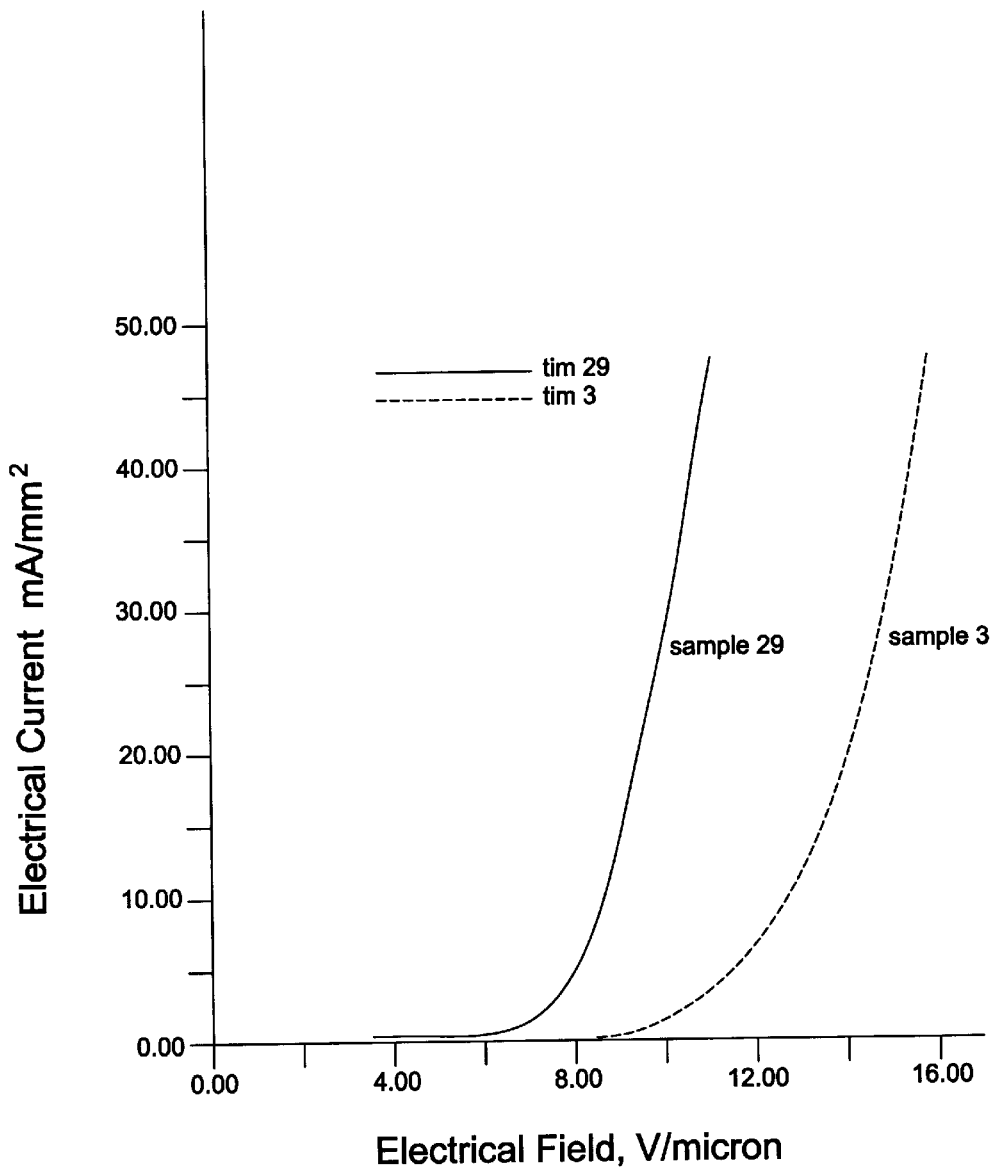
FIG. 5 is a graph of electrical current per unit area ($mA/mm^2$) emitted from the surface of a diamond film grown by the method of this invention as a function of electric field strength (V/micron) at the surface of the film.

FIG. 5 is a graph of electrical current vs. electrical field strength at the diamond film for a sample made by the method of this invention. The "turn-on" voltage is very low—about 8 v/micron, and the current density rapidly increases to above 50 $mA/mm^2$. These characteristics are satisfactory for forming cold cathodes for such applications as Field Emission Displays.

Figure 6:
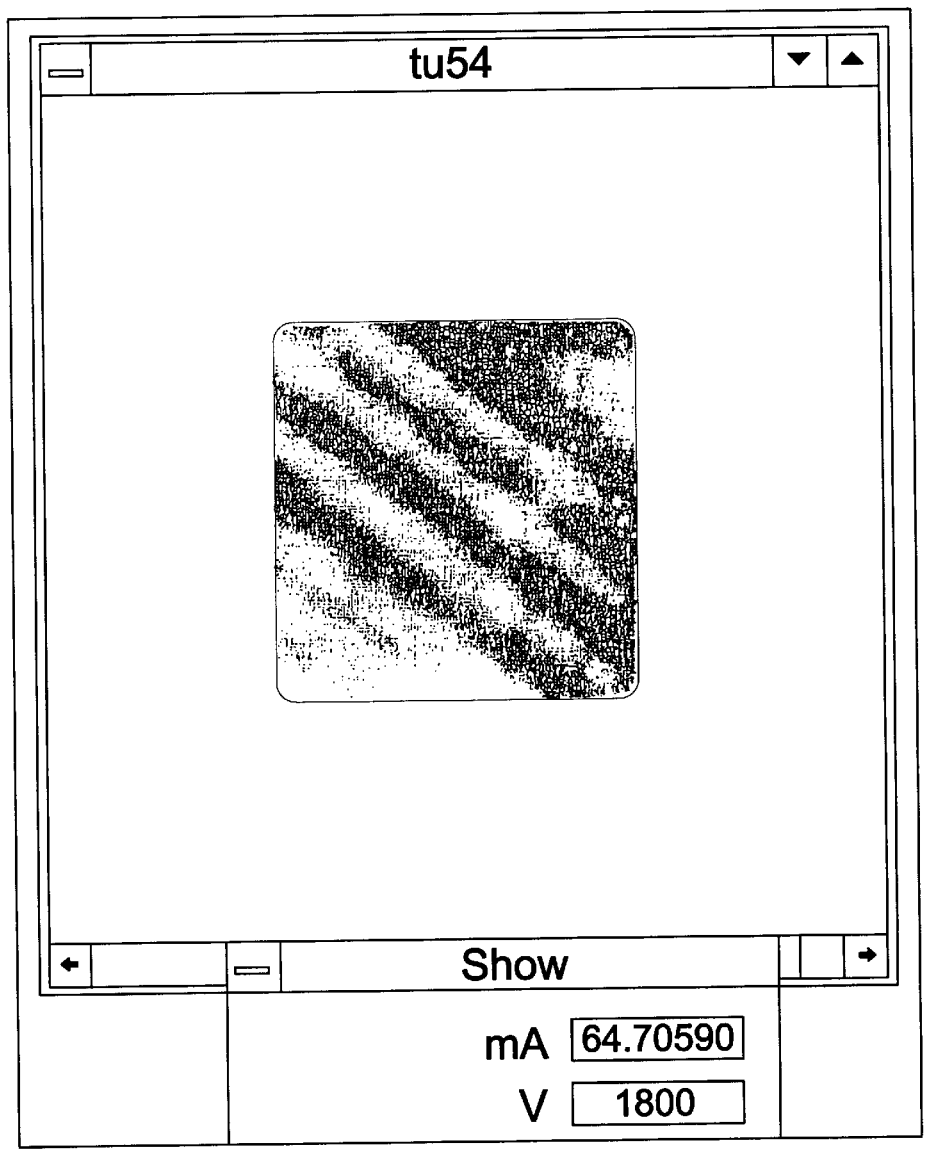
FIG. 6 is an image of emission sites on the surface of a film grown by one embodiment of the method of this invention.

The very high density of emission sites from the surface of a sample is illustrated in FIG. 6. These are micrographs of a phosphor screen in apparatus developed for observing the spatial homogeneity of the diamond films ("Examination of Electron Field Emission Efficiency and Homogeneity from CVD Diamond Films," by A. A. Rakhimov et al, pub. in *Proceedings of Applied Diamond Conference*, 1995, p. 11s. The density of bright spots increases as emission current increases. Although there is some variation in current density over the surface on a microscopic scale, the emission spatial uniformity is sufficient for the diamond film emitter to be used for such applications as Field Emission Displays. This film was grown with the substrate stationary.

Figure 7:
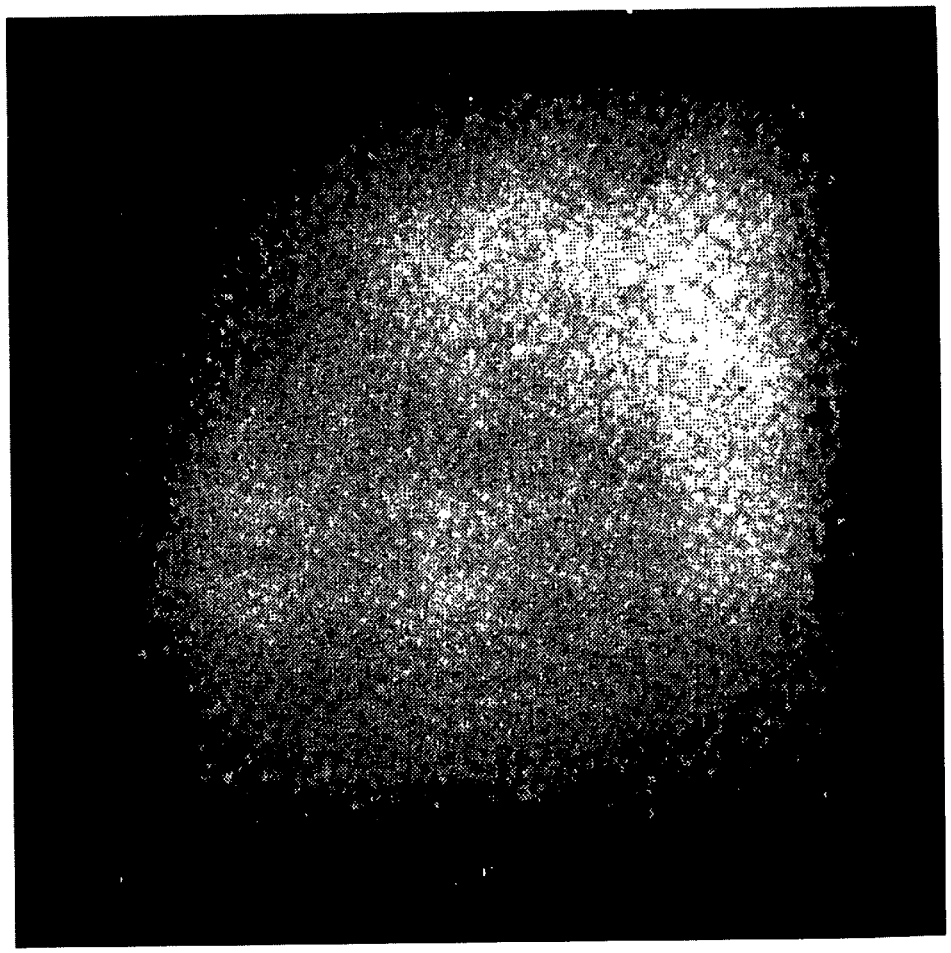
FIG. 7 is an image of emission sites on the surface of a film grown by another embodiment of the method of this invention wherein the substrate is moved during film growth.

In FIG. 6, bright and dark areas are in a linear pattern, causing spatial heterogeneity in the film emission properties, likely related to the grid structure of the grid anode. In FIG. 7 the substrate holder on which the diamond film was grown was moved as the film was grown. The dimensions of the photographs in FIGS. 6 and 7 are 15 mm. The substrate was moved back and forth over a distance about equal to the distance between the mesh wires, and at a frequency of about 100 Hz. Preferably, the amplitude of movement is at least as great as the distance between mesh wires of the anode being used.

Frequency of movement may vary widely, from about 1 Hz to about 100 Hz. Movement is provided by by a mechanically driven substrate holder. An increase in spatial homogeneity of emission from the film of FIG. 7, as compared with the film of FIG. 6, is apparent.

The invention has been described with reference to its preferred embodiments. Those of ordinary skill in the art may, upon reading this disclosure, appreciate changes or modifications which do not depart from the scope and spirit of the invention as described above or claimed hereafter.

We claim:

1. A method for depositing a nanodiamond film in a reactor by chemical vapor deposition on a substrate, comprising:
    positioning a grid anode at a selected distance from the substrate, the substrate being supporting by a substrate holder, the grid anode being comprised of electrically conducting wires;
    positioning a cathode at a selected distance from the grid anode, the grid anode being disposed between the cathode and the substrate;
    heating the substrate;
    sequentially introducing hydrogen gas and a mixture of hydrogen and a carbon-containing gas into the reactor;
    adjusting the pressure in the reactor to a selected pressure;
    supplying electrical power between the cathode and anode to form a plasma therebetween;
    heating the grid anode to a temperature in the range above about 1100° C.; and
    growing said nanodiamond film on the substrate to a selected thickness.

2. The method of claim 1, further comprising the step of positioning a second anode at a selected distance from the grid anode, the substrate being disposed between the grid anode and the second anode, wherein the grid anode and the second anode are electrically connected.

3. The method of claim 2 wherein the second anode is the substrate holder.

4. The method of claim 1 wherein the wires of the grid anode are spaced apart at a distance in the range from about 0.1 mm to about 5 mm.

5. The method of claim 1 wherein the grid anode is positioned at a distance in the range from about 0.1 mm to about 5 mm from the substrate.

6. The method of claim 1 wherein the selected pressure is in the range from about 50 torr to about 300 torr.

7. The method of claim 1 wherein the grid anode is heated to a temperature in the range from about 1100° C. to about 2500° C.

8. The method of claim 1 wherein the substrate is an electrical insulator.

9. The method of claim 1 wherein the substrate is silicon or molybdenum.

10. The method of claim 1 wherein the substrate is heated to a temperature in the range from about 700° C. to about 1100° C.

11. The method of claim 1 wherein the cathode is positioned at a distance in the range from about 5 mm to about 50 mm from the grid anode.

12. The method of claim 1 wherein the cathode is formed from a metallic plate having a plurality of drilled holes therein or from a porous metal.

13. The method of claim 1 wherein the voltage between the grid anode and the cathode is in the range from about 600 to about 1200 volts.

14. The method of claim 1 wherein the power dissipation between the cathode and anodes is in the range from about 0.1 kW/sq cm of substrate area to about 5 kW/sq cm of substrate area.

15. The method of claim 1 wherein the carbon-containing gas is methane.

16. The method of claim 1 wherein the gas flow rate is in the range from about 200 sccm to about 1000 sccm.

17. The method of claim 1 wherein the substrate is monocrystalline silicon, the substrate is heated to a temperature of about 900° C. with hydrogen in the chamber at a pressure of about 50 torr to about 300 torr for a time sufficient to remove an oxide layer from the silicon surface and a first mixture of hydrogen and carbon-containing gas consisting of a methane concentration in the range from about 7 percent to about 12 percent methane is introduced to the reactor, the first mixture contacting the silicon to form a silicon carbide layer thereon, and further comprising the step of sequentially introducing a second mixture of hydrogen and carbon-containing gas to the reactor, the second gas mixture having methane in the range from greater than 3 percent to about 6 percent, for a time sufficient to grow the nanodiamond film to a selected thickness, and then further comprising the step of contacting the film surface with hydrogen for a time sufficient to anneal the film or remove non-diamond materials from the film.

18. The method of claim 1 further comprising the step of moving the substrate holder as the nanodiamond film is being grown on the substrate.

19. The method of claim 1 further comprising the step of contacting the nanodiamond film surface with hydrogen for a time sufficient to anneal the film or remove non-diamond materials from the film.

20. A method for depositing a nanodiamond film on a substrate, comprising the steps of:
    positioning a grid anode at a selected distance from the substrate;
    positioning a cathode at a selected distance from the grid anode;
    sequentially introducing hydrogen gas and a mixture of hydrogen and a carbon-containing gas between the grid anode and the cathode;
    supplying electrical power between the cathode and anode to form a plasma therebetween; and
    heating the grid anode to a temperature in the range above about 1100° C.

* * * * *